July 15, 1969 E. M. DAVIS, JR., ETAL 3,456,159

CONNECTIONS FOR MICROMINIATURE FUNCTIONAL COMPONENTS

Original Filed Aug. 8, 1963

INVENTORS
EDWARD M. DAVIS JR.
ROBERT D. MC NUTT
ARTHUR H. MONES

BY Joseph C. Redmond Jr.

ATTORNEY 3,456,159

CONNECTIONS FOR MICROMINIATURE FUNCTIONAL COMPONENTS

Edward M. Davis, Jr., Chappaqua, and Robert D. McNutt and Arthur H. Mones, Poughkeepsie, N.Y., assignors to International Business Machines Corporation, Armonk, N.Y., a corporation of New York Original application Aug. 8, 1963, Ser. No. 300,855, now Patent No. 3,292,240. Divided and this application Oct. 3, 1966, Ser. No. 583,755
Int. Cl. H05k *1/10*
U.S. Cl. 317—101 6 Claims

ABSTRACT OF THE DISCLOSURE

Terminal elements and connections are provided for microminiaturized functional components. A circuit element includes metal strips, metal film, and a metal alloy terminal member. The circuit element is joined to a substrate having metal lands adhered thereto. The eutectic temperature of the metal lands is selected to be less than the eutectic temperature of the metal alloy terminals. A joint is effected between the metal alloy terminal and the metal land by firing the substrate with the circuit element positioned thereon for a time interval and at a temperature to partially melt the metal alloy terminal whereby the circuit element is joined to the substrate through the metal lands and assumes an elevated position with respect to the substrate.

This is a division of application Ser. No. 300,855, filed Aug. 8, 1963, now Patent No. 3,292,240.

This invention relates to terminals and connections for microminiature functional components and a method of fabricating microminiature functional components. More particularly, the invention relates to a method of fastening microminiature devices to a substrate.

Many information handling systems are based upon a plurality of "building-block" circuits which are conveniently interconnected to perform any desirable logic functions, for example, arithmetic, data storage and the like. As speed requirements for such systems increased, the technology for fabricating the "building-block" circuits or functional components developed two general alternatives. One alternative is to integrate all active and passive devices of a building-block circuit in a single member and interconnect the devices by suitable circuitry secured to the member. A second alternative is to microminiaturize the individual devices and fasten them to a miniaturized printed circuit substrate. The first alternative is generally referred to as integrated circuitry. The second alternative is generally referred to as hybrid circuitry. A brief discussion of the methods for fabricating these alternatives is described in the periodical "Electronics," published by McGraw-Hill, Feb. 15, 1963, pp. 45–60.

Presently, integrated circuitry has limitations in cost and reproducibility at commercially acceptable yields. Microminiaturized circuits, to which the present invention is directed, however, has acceptable costs and commercial reproducibility yields, but has an interconnection problem which requires a solution before the technique is entirely satisfactory.

In microminiaturized circuits active and passive or "chip" devices are secured to substrates of the order of 0.45" x 0.45" x 0.06". Active devices, as one example, which are to be secured to the substrate, are of the order of 25 mils x 25 mils. Interconnection of the active devices to the substrate is a particular problem. A number of interconnection requirements must be fulfilled before the resultant connection is acceptable. Thermal bonding processes which are widely employed to make electrical contact to semiconductor devices fail to meet one or more of these criteria. One criterion is that the interconnection must have sufficient strength to withstand normal shock and vibration associated with information handling systems. Another criterion is that the connecting material must not deteriorate or change electrical or mechanical characteristics when tested under extreme humidity and temperature conditions normally associated with such systems. Additionally, the interconnection wiring must not short circuit to the semiconductor body. The interconnection should also have a melting point sufficiently high that it will not be affected during any soldering of the substrate to a supporting card. Finally, the connecting materials should not produce a doping action on silicon or germanium active devices with which the substrate will be associated. It is desirable, therefore, to provide a method of fastening chip devices to a substrate whereby the method is readily reproducible, inexpensive and satisfies the criteria previously described.

A general object of the present invention is a readily reproducible and reliable process for fusing microminiaturized devices to substrates.

One object is a method for attaching "chip" devices to a substrate under mass production conditions.

Another object is a method for fusing "chip" devices to a substrate and simultaneously positively spacing the chips above the substrate.

Another object is a connection between a component and a conductive pattern on one surface of a substrate, the component being elevated above the pattern and in good electrical and mechanical connection therewith.

Still another object is a method for limiting movement of a "chip" device positioned on a substrate prior to fusing.

These and other objects are accomplished in accordance with the present invention, one illustrative embodiment of which comprises the steps of printng a unique metallic circuit topology on a ceramic substrate, coating the unique circuit topology with a suitable metal having a first preselected eutectic temperature, fabricating a chip device with built-up metallic contacts having a second eutectic temperature which exceeds that of the coating metal, the contact shape usually being spherical but not necessarily limited thereto, positioning the substrate and chip devices in a jig, fluxing the metallic circuit pattern at the location where the chip is desired to be positioned, operating the jig to place the chip devices in the proper position on the substrate whereby the flux acts as a glue to retain the devices in the proper position, pressing the devices into the metal having a first preselected eutectic temperature to establish a depression whereby the devices will not slide off the circuit pattern when the substrate is handled prior to the next operation and firing the substrate in an oven for a preselected time, the oven being operated at a preselected temperature to fuse the chip to the circuit through a solder reflow joint.

One feature of the present invention is a contact structure for a chip device that will fuse to a metallic coated, conductive strip on a substrate and provide both a dimensional separation with respect to the substrate and a good electrical and mechanical interconnection therebetween.

Another feature is coating a metallic circuit pattern on a substrate with a metal having a predetermined eutectic temperature, the coating metal reducing the resistivity of the circuit pattern and providing material for fabricating solder reflow joint when devices are positioned thereon.

Another feature is fluxing the metallic coated conductive strips before positioning a chip, locating the chip according to the circuit pattern, the chip being held in position by the flux which acts as a glue, and thereafter depressing the chip into the metallic coated conductive strips to provide means for retaining the chip in position during subsequent handlng thereof.

Another feature is a contact metal combination and metallic coated conductive strip on a substrate that forms an excellent solder reflow joint of good electrical and mechanical quantities at a firing temperature which does not melt the contact metal combination to thereby establish a separation between a chip device and the substrate.

Another feature is a firing cycle that does not adversely affect the electrical characteristics of an active device which is fused to a metallic coated conductive strip secured to a ceramic substrate.

The foregoing and other objects, features and advantages of the invention will be apparent from the following more particular description of the preferred embodiments of the invention, as illustrated in the accompanying drawings.

Figure 1:
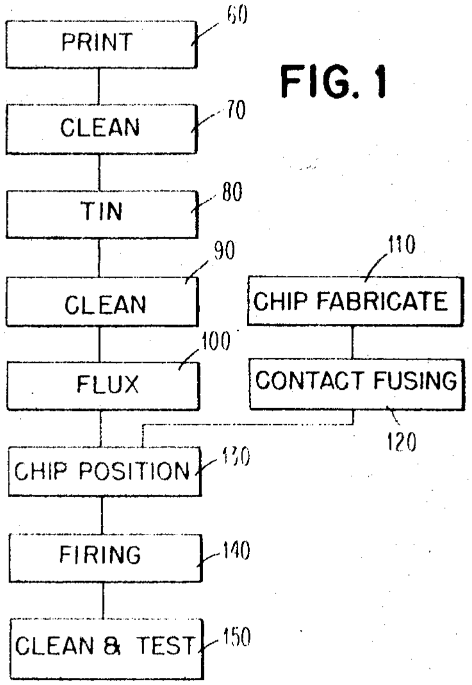
FIGURE 1 is a flow diagram that practices the principles of the present invention.
Figure 2:
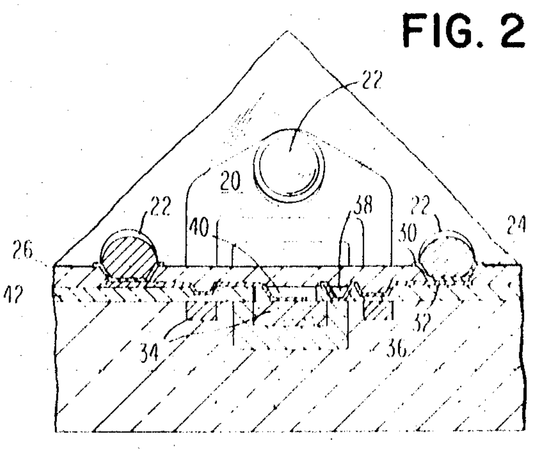
FIGURE 2 is a cut-away perspective view of a miniaturized device to be fastened to a substrate.

FIGURE 1 indicates the various steps in fabricating good electrical and mechanical interconnections between a miniaturized device or chip component and a substrate. Before considering FIGURE 1 in detail, it is believed in order to describe the elements which are to be fastened together. One element is a chip component which may be either passive or active in nature. An active chip device is described in a paper entitled "An Approach to Low Cost, High Performance Microelectronics" by E. M. Davis, W. E. Harding, R. S. Schwartz, which was presented at the Western Electronics Conference held in San Francisco, Calif., on Aug. 20, 1963. Briefly, the chip component is a glass hermetically sealed component having "built-up" contacts which aid in spacing the component from a substrate. The contacts also provide good electrical connections to the electrodes of the component. A typical chip component 20 is shown in FIGURE 2. Typically, the chip component is of the order of 25 mils x 25 mils square. Built-up contacts 22 are spherical in form but need not be limited to such a configuration. The contacts are fused to the substrate in a readily reproducible process, as will be described in more detail hereinafter. The spherical or ball contacts comprises a metal combination which has a preselected eutectic temperature. Typically, the metals are a gold and antimony alloy which may be purchased on the commercial market in a ball configuration. Other solderable metal combinations are useful, however, for example lead-tin and the like. The balls are positioned in openings 24 in a glass 26 covering the device 20. Before positioning the balls in the opening, a metal film 30 is deposited in the opening. The film has good adhesion to the glass and underlying metal strips 32 which connect to chip electrodes 34 and 36 through openings 38 and 40 in an insulating member 42 the film 30 and strips 32 forming a laminated metal pad. After positioning the balls in the openings 24, the component is quick heated to join the balls 22 and the film 30 thereby establishing a good electrical and mechanical connection between the balls and the electrodes. The form factor of the devices permits electrical testing before committing the device to the electrical connection in the circuit.

Figure 3A:
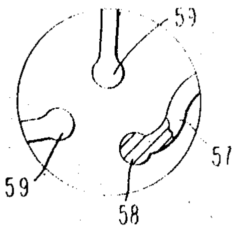
FIGURE 3A is an enlarged top view of a portion of the substrate in an area where an interconnection is desired to be formed.
Figure 3:
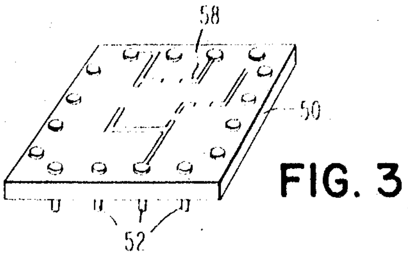
FIGURE 3 is a perspective of a substrate before fastening of miniaturized devices.

A substrate 50, shown in FIGURE 3, is the other element to which the chip is secured. The substrate is of the order of 0.45" x 0.45" in dimensions. The substrate is a good thermal conductor and has excellent high temperature properties. One material found to satisfy these criteria is a composition of 95% alumina, which is pressed or otherwise formed into a suitable geometric configuration, typically a rectangle. The substrate has terminal members 52 pressed or embedded therein. The terminals provide electrical and mechanical connection to utilization apparatus (not shown). The remaining aspects of the substrate will be elaborated upon in describing the process and apparatus for fastening the chip devices to the substrate.

Returning to FIGURE 1, the first operation in the process is printing 60 a metallic pattern of unique topology on the substrate. A conductive pattern 58 (see FIGURE 3) is secured to the substrate by silk screening or other well-known printing processes, after suitable and well-known preparation of the surface of the substrate. Briefly, a screen having a desired circuit pattern is placed over the substrate. A metallic paste is squeegeed onto the screen. The squeegee is urged against the screen to spread the paste through the screen and onto the substrate. The pattern in the screen is reproduced at a thickness determined by a number of variables, e.g., squeegee pressure, paste consistency and screen openings. Thereafter, the screen is removed and the substrate and metallic paste fired in an oven (not shown) to form the metallic conductive pattern 58 descriptive of the desired circuit configuration. The pattern may represent any particular circuit configuration which provides a logical function in an information handling system. One function is a NOR operation which requires active and passive circuit elements. A NOR circuit and operation is described in U.S. Patent 3,040,198 assigned to the same assignee as that of the present invention. Accordingly, provision is included in the pattern for connecting active or passive devices thereto. To receive the devices, fingers or connecting points 59 (see FIGURE 3A) are included in the pattern. The connecting points are grouped together according to the device to be fastened to the substrate. Three or more connecting points in closely spaced relation are required for all devices. The three points are necessary to establish a joining plane for the devices. The three points permit the devices to set on the conducting lands in co-planar relation. The electrode pattern is also connected to terminal pins 52 which connect the circuitry to utilization means (not shown).

The substrate is next subject to a cleaning operation 70 (see FIGURE 1). The cleaning operation is required to ready the substrate for the subsequent operation. To clean, the substrate is placed in a suitable container and covered with a flux remover, typically isopropanol and methyl acetate. Thereafter, the container is placed into a suitable ultrasonic tank for approximately three minutes. The substrates are next placed in a degreasing holder and cleaned for approximately five minutes in a boiling liquid of vapor degreaser. After degreasing the substrates are loaded individually into tinning racks.

A tinning operation 80 is the next in the process. The tinning operation, inter alia, insures a good electrical connection between the terminal pins and the conductive lands. Further, the series resistance of the connecting points is reduced and a solder material is made available for joining the chip components to the circuit pattern. Equal solder height across the conductive lands is very important for good device joining yields. In order to assure this solder height, the topology of conductive lands is chosen with care.

The tinning may be accomplished by a conventional solder dip process. Wave or roller soldering may also be employed. Briefly, each substrate is coated with flux and dipped into a solder bath. During dipping the substrate is held face down into the solder bath. Since the alumina substrate has a glass-like surface, solder does not adhere thereto. Solder 57 (see FIGURE 3A) does adhere to the conductors 58. The coated metallic conductors are thereafter cooled. The solder chosen has a eutectic temperature lower than that of the ball contacts 22 previously described. The lower eutectic temperature of the solder permits a reflow joint to be established between the component and the conductive land on the substrate without completely melting the ball contacts, as will be explained in more detail hereinafter.

After cooling, the substrate is subjected to a cleaning 90 (see FIGURE 1) by immersion in a vapor degreaser fluid for a period of five minutes. The substrate is next dried, and placed in inspection trays for a tinning inspection. The substrate, thereafter, is subjected to a fluxing 100 prior to receiving a chip component for joining. The flux serves to establish the proper solder surface for joining to the ball contacts of the chip and provides a sticky surface for limiting movement of chip during handling. A number of fluxes have been found to satisfy these criteria. Generally, a non-corrosive flux is desired. One flux found to perform satisfactorily is a water white rosin fluid which is applied in a thin layer over the connecting points 59 (see FIGURES 3 and 3A).

Contemporaneously with the substrate processing, fabrication 110 of the chip devices takes place. The chip devices are planar type devices with all electrode terminals on a single surface. The ball contacts (see FIGURE 2) may be 75% gold and 25% antimony alloy as previously mentioned. The gold and antimony metals are joined or fused to the chip device. The details of the contact fusing operation 120 are described in a paper entitled "Hermetically Sealed Chip Diodes and Transistors" by J. L. Langdon, W. E. Mutter, R. P. Pecoraro, K. K. Schuegraph, presented at the 1961 Electron Device Meeting in Washington, D.C., on Oct. 27, 1961. The gold and antimony alloy has a eutectic temperature of the order of 360° C. To prevent melting of the ball contacts, the solder coating 57 of the substrate conductors 58 has a eutectic temperature at least 50 degrees less than that of the gold-antimony alloy. One coating solder found to be suitable is a 90% lead, 10% tin solder which has a melting temperature of the order of 305° C. The eutectic temperature difference between the ball contact 22 and the solder metal 57 permits a solder reflow joint to be established between the substrate conductor 58 and the chip 20 before the ball contacts 22 melt. The ball contacts, therefore, will provide positive spacing between the chip and the substrate so that no short circuiting or other electrical and mechanical defects occur. The exact cycle for this joining will be discussed hereinafter. Prior to joining, it is next required to position properly the devices on the connection points.

Figure 4:
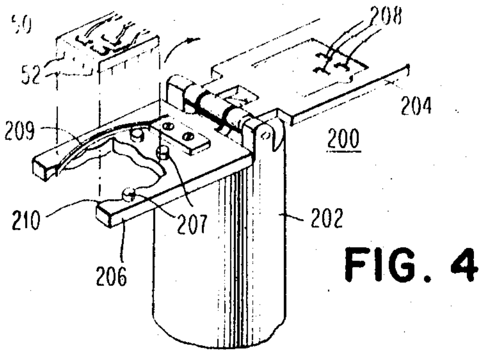
FIGURE 4 is a perspective view of a fixture for positioning the miniaturized device of FIGURE 2 on the substrate of FIGURE 3.

Before describing a chip positioning operation 130, it is believed in order to describe a chip positioning fixture or apparatus which aids the positioning of a plurality of 25 mil x 25 mil devices on a 0.45" x 0.45" substrate having spacings of 0.005" separations between fingers or connecting points. In FIGURE 4 a fixture 200 is adapted to perform such an operation. The fixture has a rotatable post 202 positioned on a suitable pedestal (not shown). The post has a pair of flaps 204 and 206 suitably hinged to the post. The flap 204 has rectangular openings 208 for positioning chip devices. The flap 206 has three pins 207 for locating the substrate 50 and an opening 210 to provide clearance for the pins 52. A spring 209 provides a pressure means for retaining the substrate against the three locating pins. Normally, both flaps rest in a horizontal plane and diametrically opposite to one another. The flap 206 is so arranged and constructed that when raised first and brought into contact with the flap 204 resting in a horizontal plane, the substrate is brought into proper engagement with the positioned chips so that the connecting points on the conductive pattern of the substrate 50 match the connecting points on the chips positioned in the flap 204.

Returning to the chip positioning operation 130, an operator places the necessary chips on position points 208 (see FIGURE 4) while the flaps are in the normal or horizontal plane. To aid registration of the chip and land, the solder lands may be dimpled by suitable apparatus. The substrate 50 is positioned against the locating pins around opening 210. The substrate is thus oriented in the opening to bring the connecting points into juxtaposition with the chip devices when the flap 206 is rotated into an inverted parallel position with the flap 204. With the flap 206 superposed above the flap 204, the chips stick to the substrate due to the flux applied to the conductive pattern and the weight of the flap and substrate on the chips. The flux acts as a glue to hold the chip on the substrate at the proper position during subsequent handling operation before firing. Next the chip and substrate flaps 204 and 206, respectively, are rotate 180° to the diametrically opposite position so that the substrate 50 is in the upright position. Now the chip flap is superposed above the substrate flap. Thereafter, the chip flap 204 alone is rotated back to the start position and transfer of the chips to the precise locations on the substrate is realized.

Figure 5:
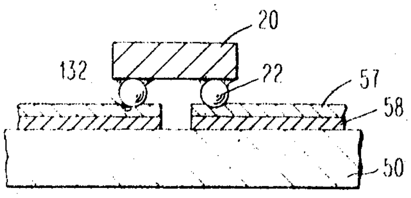
FIGURE 5 is a cross-sectional view of a miniaturized device positioned on the conductive lands of FIGURE 3 prior to fusing.

Prior to the return of the flap 204 to the normal or start position, the flaps are urged or pressed together so that the ball contacts establish slight depression 132 (see FIGURE 5) in solder metal. The depression 132 establishes a cold weld between the metals which aid in restraining the chip from sliding off the contact metal during subsequent handling operations. Compressing the chip contacts and land metals may be used to form a joint sufficiently strong to permit subsequent handling and firing of the substrate without the need for a sticky flux.

Figure 6:
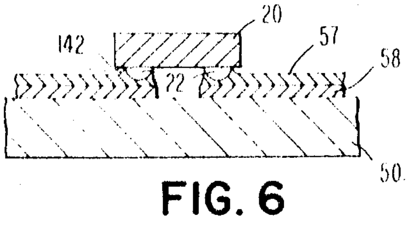
FIGURE 6 is a cross-sectional view of the miniaturized device fused to the conductive members secured to the substrate.

A firing opreation 140 for fusing the devices to the substrate conductor is next performed. Firing for gold antimony contacts and tin-lead lands is accomplished by placing the substrate in a conventional furnace which is set at a temperature considerably higher than the solder melting temperatures. Laboratory experimentation has revealed that for contact metals of the type described, that is 75% gold, 25% antimony ball contacts and a 90% lead, 10% tin substrate conductor solder, and a furnace system operated at 700° C. approximately twenty-five seconds are required for the substrate to reach 320° C. This temperature is less than the ball contact sphere liquidus point but greater than the solder liquidus point of 305° C. For the twenty-five second heating cycle the land solder melts with little or no effect on the ball contact configuration. The substrate and fused devices are removed from the oven at the end of the twenty-five seconds and placed under an air blower for air cooling. The controlled quenching of the fusing by an air blower restricts the solder joint to the area in the vicinity of the connecting points and prevents the complete alloying of the ball 22 with the solder 57. As shown in FIGURE 6, solder fillets 142 extend up the entire side of the sphere and fuse the device to the conductors 58. The spheres retain their basic shape and positively space the chip body away from the substrate. The positive displacement prevents any short circuit or other electrical and mechanical defect from appearing in the microminiaturized circuit. There is no bridging between the joints. All joints are continuous and joint resistance is below a mille ohm. Under mechanical testing, the joints were shear tested with shear failures occurring between the spheres and the chip with occasional failures between the circuit solder and the substrate. The completed microcircuits are subjected to a clean and test operation 150. First the microcircuits are given a five minute soak in an alfa-flux remover followed by a ten minute degreasing in the vapor of the flux remover. The finished product is ultrasonically washed in isopropyl alcohol. The module is thereafter subjected to testing and inspection for quality of electrical and mechanical interconnections.

The process provides a reliable and reproducible method of fabricating small .005" diameter solder joints on .015" centers. The joints are made between 25 mil square x 8 mil thick silicon chips and connecting points 5 mils in width. Optimum fusings were obtained with furnace temperatures of the order of 700° C. for time intervals of from 23 seconds to 27.5 seconds. The peak temperature the reflow joint reached was varied from 350° C. to about 305° C. with the optimum reflow temperature being around 320° C. The lower end of the joint temperature range produced joints of very small fillets while the upper end produced completely dissolved spheres. Connecting point line widths of .015" with .0055" spacing between points provide sufficient solder for reflow with no problems of bridging.

Although the description has disclosed joining active devices to substrates, passive elements described for example in IBM Technical Disclosure Bulletin, vol. 5, No. 10, March 1963, page 115, may be joined in a corresponding manner.

Summarizing briefly, the present invention has provided a method for fabricating reliable circuit interconnections between a "building-block" circuit and the devices employed in the circuit. Each step in the process is readily suitable for automated operation. The process permits more than one chip to be joined to a substrate at one time. The process enables a plurality of connections to be made on one chip. Thus, the truly microminiaturized circuit is readily connected to utilization circuits. No particular process step requires any technical skill for performance. The solder connections between the chip devices and the substrate have a melting point sufficiently high that melting will not occur during any subsequent soldering of the substrate to a supporting card. Further, the final joint has a sufficient clearance between the chip and the substrate so that any flux residue is not trapped during the cleaning process. Short circuits or other mechanical or electrical defects are also eliminated. Laboratory examination has revealed the joint has sufficient strength to withstand normal shock and vibration associated with information handling and computer systems. The joint material is of a solderable material that will not deteriorate or change electrical or mechanical characteristics when tested under extreme humidity and temperature conditions normally associated with computer systems. Thus, the method and apparatus provide a novel arrangement for fabricating reliable, rugged and cost oriented microminiaturized circuits which are necessary to build present day and future information handling systems.

While the invention has been particularly shown and described with reference to preferred embodiments thereof, it will be understood by those skilled in the art that various changes in form and details may be made therein without departing from the spirit and scope of the invention.

What is claimed is:

1. A connection between an electrical component and a circuit panel comprising:

an electrical component having metal strips, a metal film and metal alloy contact members, an insulating member including a conductive pattern wherein a metal alloy coating covers at least a portion of the pattern, and a bonded joint between the contacts and the conductive pattern, the joint supporting the component in an elevated position relative to the pattern.

2. The connection defined in claim 1 wherein the contact members have a preselected eutectic temperature.

3. The connection defined in claim 2 wherein the joint is a fused union between the contacts and the pattern.

4. The connection defined in claim 3 wherein the joint is to one surface only of the insulating member.

5. The connection defined in claim 4 wherein the contacts have a first eutectic temperature and the metal coating on the conductive member has a second eutectic temperature that is less than the first eutectic temperature.

6. The connection defined in claim 5 wherein the contacts comprise a combination of about 75% gold and about 25% antimony and the metal coating on the conductive member comprises about 90% lead and 10% tin.

References Cited

UNITED STATES PATENTS

| | | | |
|---|---|---|---|
| 3,280,019 | 10/1966 | Harding et al. | |
| 3,292,240 | 12/1966 | McNutt et al. | |
| 3,302,067 | 1/1967 | Jackson et al. | |
| 3,303,393 | 2/1967 | Hymes et al. | |
| 3,184,831 | 5/1965 | Siebertz | 29—155.5 |
| 3,202,888 | 8/1965 | Evander et al. | 317—234 |
| 3,256,465 | 6/1966 | Weissenstern et al. | 317—101 |

FOREIGN PATENTS

| | | |
|---|---|---|
| 724,379 | 2/1955 | Great Britain. |

OTHER REFERENCES

"The Construction of a Thin-Film Integrated Circuit I.F. Amplifier," by J. R. Black, 1960 Proceedings of the National Electronics Conference, vol. XVI, pp. 211–219, Oct. 10, 1960.

"Design and Fabrication of a Microelectronic I.F. Amplifier," by J. R. Black, 1960 IRE Wescon Convention Record, pp. 114–118, Aug. 23, 1960.

ROBERT S. MACON, Primary Examiner

U.S. Cl. X.R.

29—155.5; 174—68.5; 317—234